United States Patent [19]

Cerda

[11] Patent Number: 5,083,369
[45] Date of Patent: Jan. 28, 1992

[54] METHOD AND DEVICE FOR FORMING WIRING HARNESSES

[75] Inventor: Léon G. Cerda, Carry-Le-Rouet, France

[73] Assignee: Societe Anonyme Dite: Aerospatiale Societe Nationale Industrielle, Paris, France

[21] Appl. No.: 538,119

[22] Filed: Jun. 14, 1990

[30] Foreign Application Priority Data

Jun. 15, 1989 [FR] France .................. 8907972

[51] Int. Cl.$^5$ .................. H01R 43/00; B73P 19/00
[52] U.S. Cl. .................. 29/857; 29/747; 29/748; 29/861
[58] Field of Search .................. 29/857, 866, 868, 747, 29/748, 749, 56.6, 861

[56] References Cited

U.S. PATENT DOCUMENTS

| 4,428,114 | 1/1985 | Teagno | 29/748 X |
| 4,440,053 | 4/1985 | Suzuki et al. | 29/861 X |
| 4,581,796 | 4/1986 | Fukuda et al. | 29/748 X |
| 4,763,411 | 8/1988 | Takeshita | 29/748 X |
| 4,785,529 | 11/1988 | Grella et al. | 29/748 X |
| 4,835,858 | 6/1989 | Adlon et al. | |
| 4,855,927 | 9/1990 | Aiello | 29/747 X |

FOREIGN PATENT DOCUMENTS

0182591 5/1986 European Pat. Off. .
2087760 6/1982 United Kingdom .

Primary Examiner—Carl J. Arbes
Attorney, Agent, or Firm—Marshall, O'Toole, Gerstein, Murray & Bicknell

[57] ABSTRACT

A method and device are disclosed for forming a wiring harness, wherein:
a) individual sliding guide members are provided;
b) the connectors are disposed side by side;
c) as many sliding guide members are disposed side by side as is necessary for defining the junction nodes;
d) the ends of each conductor are connected to the appopriate coupling positions of the two connectors which are to be connected by said conductor, by causing this conductor to pass through the corresponding sliding guide member(s);
e) said sliding guide members and said connectors are moved away from each other; and
f) the conductors belonging to the same bundle are bound together.

12 Claims, 5 Drawing Sheets

METHOD AND DEVICE FOR FORMING WIRING HARNESSES

BACKGROUND OF THE INVENTION

The present invention relates to a method and device for forming a wiring harness comprising a plurality of conductors and connectors, said connectors being each provided with coupling positions for conductor ends and occupying given geographic positions, whereas each conductor follows a path also predetermined inside said wiring harness to connect a coupling position of one connector to a coupling position of another connector, the paths of said conductors having common portions along which said conductors are bound together to form bundles.

The invention applies more particularly, although not exclusively, to the formation of wiring harnesses for aircraft and particularly for helicopters, in which said wiring harnesses connecting together the numerous pieces of electric and electronic equipment required for piloting said aircraft and for executing the different missions which they must carry out, are very complex and varied.

Before installing said wiring harnesses, for example in an aircraft which they are to equip, it is necessary to shape said harnesses, in accordance with the internal arrangement of the aircraft, on long tables (up to 10 meters or so in length), each conductor extending on the table between specific input and output positions, following a predetermined path.

At the present time, the paths of the different conductors forming the wiring harness are represented graphically on a sheet of paper disposed on the table, under a transparent plate formed with a plurality of holes for receiving guide pins for maintaining the conductors temporarily in position along their path.

For each conductor to be positioned, the operator must first of all identify it then, by means of technical documentation, search among the plurality of paths for the one which corresponds to the conductor he has just identified. The operator may then position the conductor following the plot of its path, and holding it there by means of guide pins disposed, by the operator, in appropriate positions along the path. The operator must of course begin this set of operations again for each conductor of the harness.

Such work is obviously fastidious and errors are practically inevitable, considering both the length of the tables and the fact that the formation of such harnesses may use several hundred conductors. Even though a "skeleton" of the harness is represented on the table, the operator finds himself in fact in front of a veritable "jumble" of interlaced conductors which are difficult to control.

The object of the present invention is to overcome these drawbacks, and provides a method and device for automatically forming such wiring harnesses.

SUMMARY OF THE INVENTION

As used herein, the term "node" refers to a point in a bundle of conductors at which two or more small bundles joint to form a larger bundle, or alternately, a point at which a bundle separates into two or more smaller bundles.

For this, in accordance with the invention, the method of forming a wiring harness comprising a plurality of conductors and connectors, said connectors being each provided with coupling positions for conductor ends and occupying given geographic positions in said harness, whereas each conductor follows a given path inside said wiring harness for connecting a coupling position of one connector to a coupling position of another connector, the paths of said conductors having common sections along which said conductors are bound together in bundles and said wiring harness having an elongate structure comprising a main longitudinal bundle and lateral bundles connected thereto at junction nodes, is remarkable in that:

a) individual sliding guide members are provided for assembling together the conductors belonging to the same bundle and separating the conductors of different bundles from each other.

b) said connectors are disposed side by side in the order in which they are located along said main longitudinal bundle;

c) as many sliding guide members are disposed side by side as is necessary for defining said junction nodes;

d) the ends of each conductor are connected to the appropriate coupling positions of the two connectors which must be connected by said conductor, by causing this conductor to pass through the corresponding sliding guide members;

e) said sliding guide members are moved away from each other until they coincide with said junction nodes of the lateral bundles at the main bundle and said connectors are moved away from each other until said conductors are stretched;

f) the conductors belonging to the same bundle are bound together and g) the wiring harness thus obtained is released from said sliding guide members.

As can be seen, the different operations b) to g) above may readily by carried out wholly or partly by robots, so that, as will be clear below, it is possible with the invention to robotize the manufacture of the wiring harnesses at least partially. In fact, with the conductor prepared for mounting, i.e. cut to length, with its ends bared of its insulating sheath and comprising if required, in a way known per se, pins for fitting into the coupling positions of the connectors, may, after identification and determination of its path—by the reader of a plan or consultation of the memory of a computer—be connected by a robot to the corresponding connectors, said connectors and said sliding guide members being themselves moved by robots It will be noted that the preparation of the conductors may itself be robotized, said conductors being cut from continuous cables unwound from reels, marked and gripped for coupling thereof. The whole of the procedure for forming a wiring harness in accordance with the invention may then be controlled by computer.

In the case where at least some of the lateral bundles and/or the longitudinal bundle have non rectilinear paths, a subsequent shaping operation of said bundles may if required be carried out, so that they have their final form and said connectors occupy the relative geographic positions which they occupy in said wiring harness.

It is advantageous:

in operation b) for said connectors in position close to each other to form at least approximately an alignment;

in operation c) for said sliding guide members in position close to each other to form an alignment at least approximately; and for said alignment of sliding guide members to be disposed at least substantially parallel to said alignment of connectors.

In this case, in order to simplify the mechanization of the different operations, said connector and sliding guide member alignments are at least substantially parallel to said main longitudinal bundle of the wiring harness to be obtained. It is then advantageous, in operation e), for the spacing apart of said sliding guide members to occur along said sliding guide member alignment, whereas the spacing apart of said connectors occurs along said connector alignment, as well as transversely to this latter alignment.

It will be noted that, in the case where said lateral bundles are distributed on each side of said main longitudinal bundle, the spacing of said connectors transversely to said alignment which they form could be made on each side of this alignment, in agreement with the arrangement of each lateral bundle. However, still for the purpose of simplifying the mechanization of the operations, it is preferable for all the connectors to be spaced transversely apart from said alignment which they form, on the same side, the distribution of the lateral bundles on each side of the main longitudinal bundle then taking place subsequently. Thus, whatever the side of the main longitudinal bundle on which said lateral bundles are located, said transverse spacing apart of the connectors is provided on a single side of said connector alignment, the lateral bundles to be located on the opposite side being brought back to the right side in a subsequent operation.

In the case of a wiring harness in which at least some of said lateral bundles comprise branch lateral bundles having connectors at their free ends, it is advantageous to provide additional sliding guide members associated with the junction nodes of the branch bundles at the lateral bundles and:

in operation b) for the connectors coupled to the ends of said branch bundles to be inserted among the connectors of the lateral bundles;

in operation c) for said additional sliding guide members to be disposed in position close to each other while being inserted in the other sliding guide members;

in operation d) for the conductors concerned to pass through the additional sliding guide members; and in operation e) for the additional sliding guide members to be moved away from each other by sliding along the conductors until they coincide with said junction nodes between the branch bundles and the lateral bundles.

As before, it is preferable, in operation c), for said additional sliding guide members to form an alignment in the closed up position, said alignment being either that of the connectors or an alignment parallel thereto and to that of the sliding guide members associated with the junction nodes between the lateral bundles and the main bundle. In this case, as for the main sliding guide members and for same reasons of simplicity, in operation e) the moving apart of said additional sliding guide members takes place along the alignment in which they are situated.

The present invention relates in addition to a device for implementing the method. Such a device may be particularly simple and comprise :

a support, sliding guide members capable of moving over said support, and members for holding the connectors in position, said holding members being able to move over said support.

It may further comprise means for moving said connector guiding and holding members, as well as means for coupling the ends of said conductors to the connectors.

Such a support, preferably flat, could be disposed vertically like the known manual manufacturing supports, or else be slanted. However, for facilitating mechanical manufacture, it is advantageous for this support to be in the form of a horizontal table. This table then advantageously comprises means for guiding the movements of said sliding guide members and said holding members of the connectors along parallel rectilinear paths. Said table may then be in the form of a transfer chain.

During operation d), so that the coupled conductors do not clutter up said support, it is advantageous for it to be such that a considerable portion of each conductor connected to two connectors in the closed up position is not supported by said support and may hang vertically down thereoutside. It can be seen that it is then advantageous for all the conductors to hang on the same side of the support, which releases the other side thereof and allows subsequent transverse moving part of said connectors.

Said sliding guide members may be formed by simple pins, used in pairs.

Of course, the device according to the invention may comprise means for cutting to length, identifying and preparing each conductor before coupling. It may be controlled, particularly in so far as these latter means are concerned, by computing means provided for moving said sliding guide members and said holding members of the connectors.

BRIEF DESCRIPTION OF THE DRAWINGS

The figures of the accompanying drawings will better show how the invention may be practiced. In these figures, identical references designate similar elements.

DESCRIPTION OF THE PREFERRED EMBODIMENTS

Figure 1:
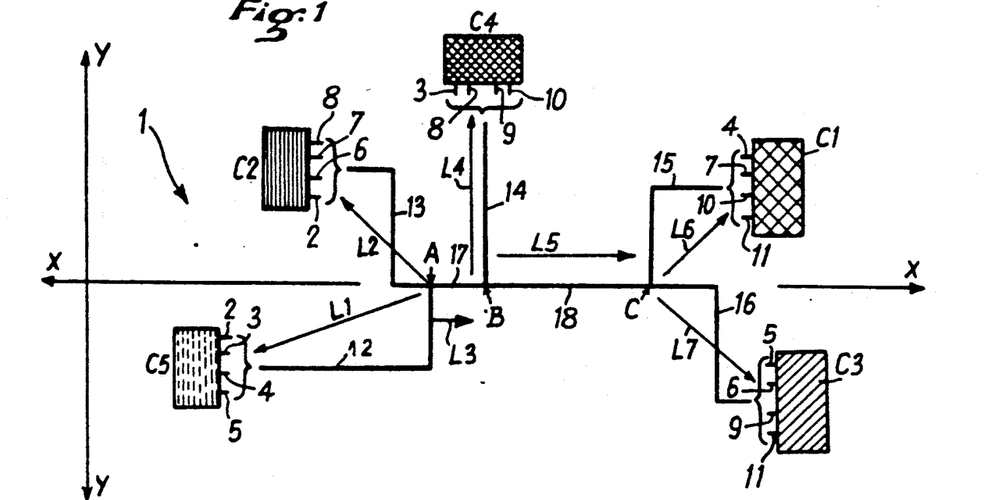
FIG. 1 shows a simplified schematic example of a wiring harness to be formed in accordance with the invention.

In the first particular example of putting the invention into practice, illustrated schematically in FIGS. 1 to 6, it is assumed that the wiring harness 1 to be formed (see FIG. 1) :

comprises five connectors, referenced respectively C1 to C5, each comprising four coupling positions; and each connector has an electric connection with each of the other four.

Thus, in this embodiment:
- a conductor 2 connects together a coupling position of connector C5 and a coupling position of connector C2;
- a conductor 3 connects together a coupling position of connector C5 and a coupling position of connector C4;
- a conductor 4 connects together a coupling position of connector C5 and a coupling position of connector C1;
- a conductor 5 connects together a coupling position of connector C5 and a coupling position of connector C3;
- a conductor 6 connects together a coupling position of connector C2 and a coupling position of connector C3;
- a conductor 7 connects together a coupling position of connector C2 and a coupling position of connector C1;
- a conductor 8 connects together a coupling position of connector C2 and a coupling position of connector C4;
- a conductor 9 connects together a coupling position of connector C4 and a coupling position of connector C3;
- a conductor 10 connects together a coupling position of connector C4 and a coupling position of connector C1; and
- a conductor 11 connects together a coupling position of connector C1 and a coupling position of connector C3.

Each of the conductors 2 to 11 follow a given path.

As can be seen in FIG. 1, the connectors occupy different geographic positions, defined as a function of the arrangement of the different pieces of equipment to be connected together with the wiring harness 1. Furthermore:
- conductors 2, 3, 4 and 5 connected to connector C5 are bound together so as to form a bundle 12;
- conductors 2, 6, 7, 8 connected to connector C2 are bound together so as to form a bundle 13;
- conductors 3, 8, 9, 10 connected to connector C4 are bound together so as to form a bundle 14;
- conductors 4, 7, 10, 11 connected to connector C1 are bound together so as to form a bundle 15;
- conductors 5, 6, 9, 11 connected to connector C3 are bound together so as to form a bundle 16;
- bundles 12 and 13 are bound together at a point (or node) A so as to form a bundle 17, comprising the conductors 3, 4, 5, 6, 7 and 8;
- bundles 4 and 17 are bound together at a point (or node) B so as to form a bundle 18 comprising the conductors 4, 5, 6, 7, 9 and 10; and
- bundles 15 and 16 are bound together at a point (or node) C so as to form the said bundle 18.

As is usual in this type of wiring harness, the harness 1 is elongate in a main direction X—X, defined by bundles 17 and 18 which form a main longitudinal bundle, the lateral bundles 12, 13, 14, 15 and 16 forming lateral branches with respect to the main longitudinal bundle 17-18 and connectors C1 to C5 being spaced therefrom, parallel to a transverse direction Y—Y.

It will be noted that connectors C1, C2 and C4 are disposed on one side of the main longitudinal bundle 17-18 and that connectors C3 and C5 are disposed on the other side thereof. Furthermore, only the lateral bundle 14 is rectilinear; the other lateral bundles 12, 13, 15 and 16 have a sinuous shape.

By L1, L2, L3, L4, L5, L6 and L7 are designated respectively the developed lengths between connector C5 and point A, between connector C2 and point A, between points A and B, between connector C4 and point B, between points B and C, between connector C1 and point C and between connector C3 and point C.

Thus it can be seen that the length of each conductor 2 to 11 may be expressed from the length L1 to L7.

For example, the developed length of conductor 2 is equal to L1+L2, whereas that of conductor 6 is equal to L2+L3+L5+L7.

Thus, from a plan representing the wiring harness 1 in the manner of FIG. 1, all the conductors 2 to 11 may be prepared to the correct length, taking into account of course the bared length of the ends thereof, which is necessary for coupling to the respective connectors.

Figure 2:
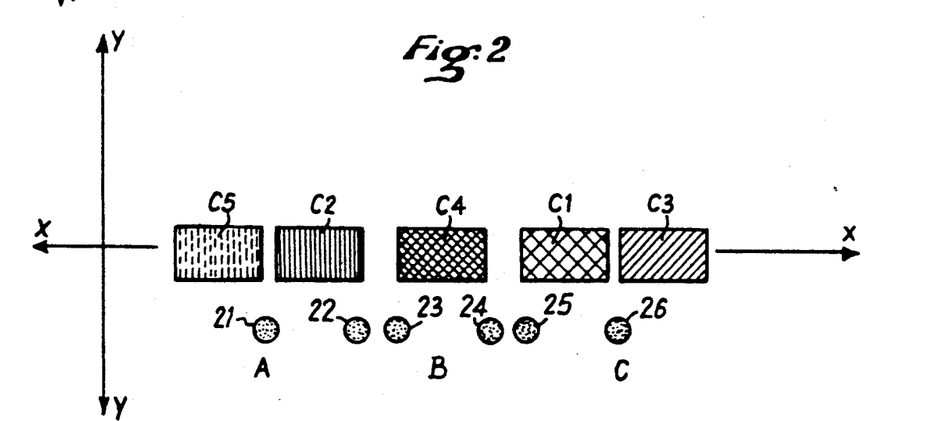
FIGS. 2 to 6 illustrate schematically steps of the method of the invention for forming the wiring harness of FIG. 1.

For forming the wiring harness 1 using the method of the invention, said connectors C1 to C5 are disposed (see FIG. 2) side by side, for example so as to form an alignment in direction X—X. In this alignment, said connectors are disposed in the order in which they are met along the axis X—X in said wiring harness 1. In addition, mobile pins 21 to 26 are provided which, as can be seen in FIG. 2, are associated in pairs, close to each other and forming an alignment parallel to the direction X—X. As will be seen below, the purpose of the mobile pins 21 to 26 is to define the position of the junction nodes A, B and C. Pins 21 and 22 are associated with a connector C2 and surround the coupling positions thereof. Pins 23 and 24, on the one hand and 25 and 26 on the other are respectively associated with connectors C4 and C1, under the same conditions.

Connectors C1 to C5 and pins 21 to 26 being in the close relative positions shown in FIG. 2, coupling of the different conductors 2 to 11 begins. Thus (see FIG. 3) conductor 2 is positioned for connecting connector C5 and connector C2 together, this conductor 2 passing between pins 21 and 22 in the vicinity of connector C2. Similarly, conductors 3, 4 and 5 are coupled to the connectors C5, C4, C1 and C3, conductors 3 and 4 being passed respectively between pins 23 and 24, on the one hand, and 25 and 26, on the other hand, in the vicinity of connectors C4 and C1.

Coupling of the different conductors continues so that, at the end of said coupling (see FIG. 4):
- in the vicinity of said connector C2, conductors 2, 6, 7 and 8 pass between pins 21 and 22;
- in the vicinity of connector C4, conductors 3, 8, 9 and 10 pass between pins 23 and 24; and
- in the vicinity of connector C1, the conductors 4, 7, 10 and 11 pass between pins 25 and 26.

Figure 5:
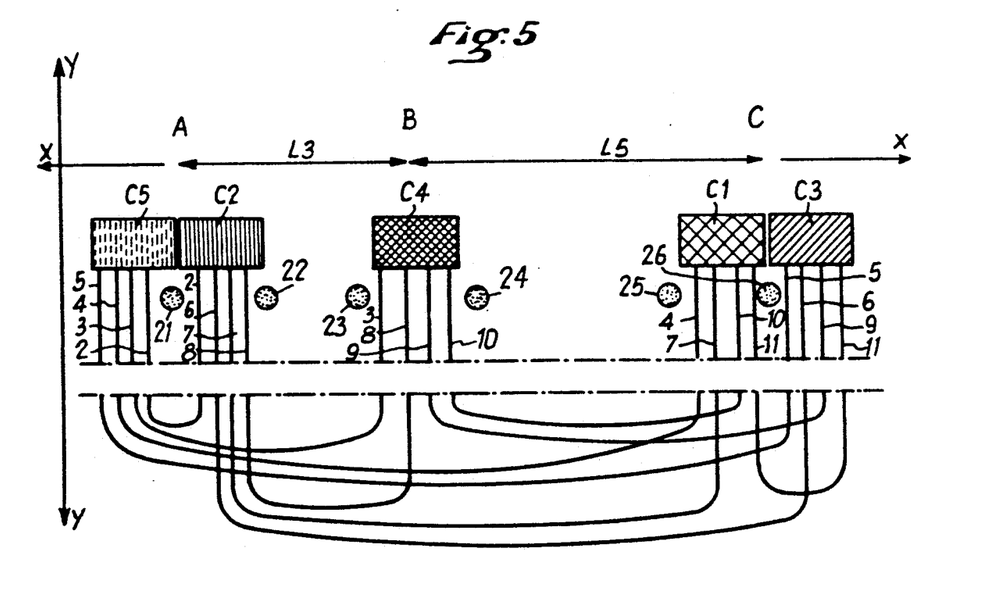

When such coupling is finished, as is shown in FIG. 5, a first relative movement of connectors C1 to C5 and pin pairs 21 to 26 takes place by moving apart along direction X—X.

Thus, at the end of this first relative movement
- connectors C5 and C2 remain close together and are disposed in the vicinity of the junction node A, defined at least approximately by the pair of pins 21 and 22;
- connector C4 and the pair of pins 23 and 24 are located in the vicinity of junction node B, defined at least approximately by said pins 23 and 24; and
- connectors C1 and C3 are close together and are disposed in the vicinity of the junction node C, defined at least approximately by the pair of pins 25 and 26.

Then (see FIG. 6), the pins of each pair of pins are brought close to each other so as to accurately define therebetween respectively the junction nodes A, B and C, after which connectors C1 to C5 are drawn parallel to the transverse direction Y—Y, on the same side of the main bundle 17-18 until the slack in the conductors is taken up. During such pulling of C1 to C5, conductors 2 to 11 slide on the closely spaced pins of the corresponding pair of pins. In this relative position, it is possible to bind together the conductors having common path portions so as to form respectively the lateral bundles 12 to 16 and the main bundle 17-18 (situation shown in FIG. 6).

Figure 6:
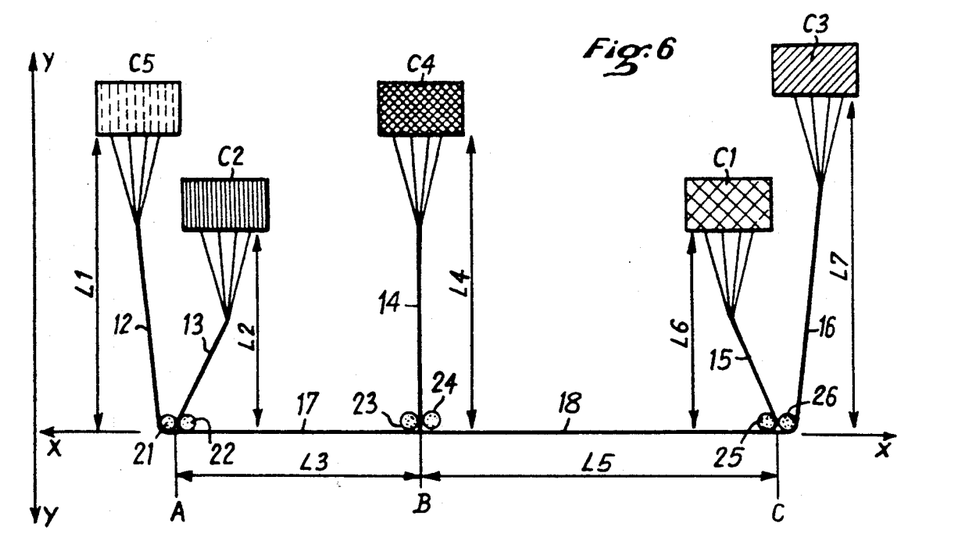

From the intermediate wiring harness shown in FIG. 6, in order to obtain the final wiring harness 1, it is sufficient to cause bundles 12 and 16 to pass, by deformation, on the opposite side of the main bundle 17-18 and to form bundles 12, 13, 15 and 16 to their final shape.

Figure 7:
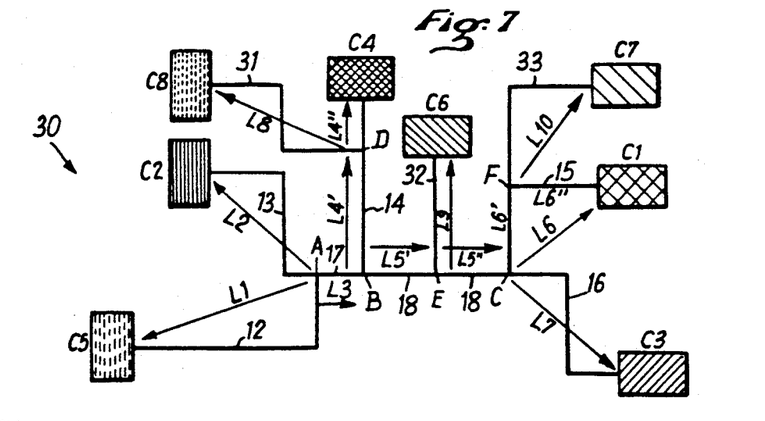
FIG. 7 shows another schematic simplified example of a wiring harness to be formed using the invention.

In the wiring harness 30, illustrated in a simplified and schematic way in FIG. 7, we find again the wiring harness 1 with its connectors C1 to C5, its bundles 12 to 18 and its junction nodes A, B and C. The wiring harness 30 further comprises:

- a branch bundle 31, of developed length L8, coupled to a connector C8 and branching off from the main bundle 14, from a junction node D disposed at a distance L4' from node B and a distance L4" from the connector C4, with L4'+L4"=L4.
- an additional bundle 32, of length L9, coupled to a connector C6 and branching off from the main bundle 17-18, from a junction node E disposed at a distance L5' from node B and at a distance L5" from node C, with L5'+L5"=L5; and
- a branch bundle 333, of developed length L10, connected to a connector C7 and branching off from the main bundle 15, from a junction node F, disposed at a distance L6' from node C and at a distance L6" from connector C1, with L6'+L6'=L6.

Figure 8:
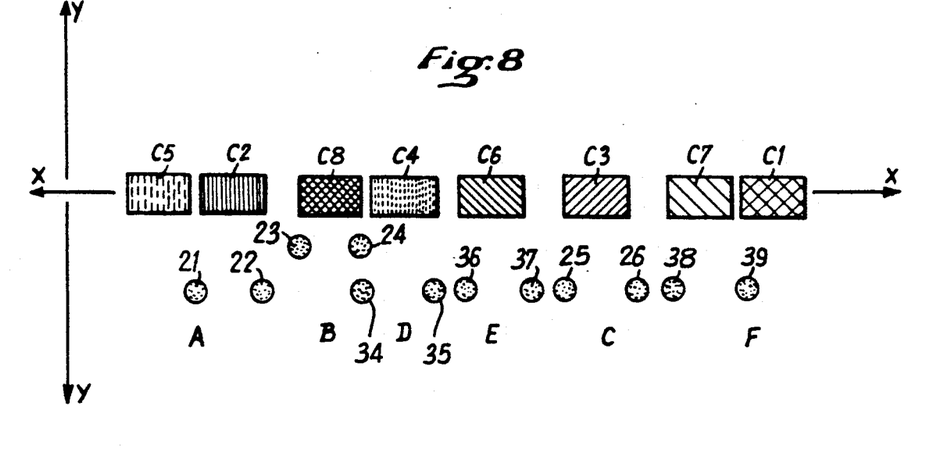
FIGS. 8 to 12 illustrate schematically steps of the method of the invention for forming the wiring harness of FIG. 1 as well as portions of the device of the invention for implementing the method.

In a preparatory step in forming the wiring harness 30 (see FIG. 8 comparable to FIG. 2), the alignment of connectors C1 to C5 in the closed up position of connectors C1 to C5 is formed with interpositioning of connectors C6, C7 and C8 and the pairs of pins 21 and 22, 23 and 24, 25 and 26 are provided, respectively, for defining the junction nodes A, B and C. In addition, pairs of pins 34-35, 36-37 and 38-39 are provided, respectively associated with connectors C4, C6 ad C7 for defining nodes D, E and F.

For simplifying mounting and avoiding congestion difficulties, said pins may be mounted in several parallel alignments.

Figure 9:
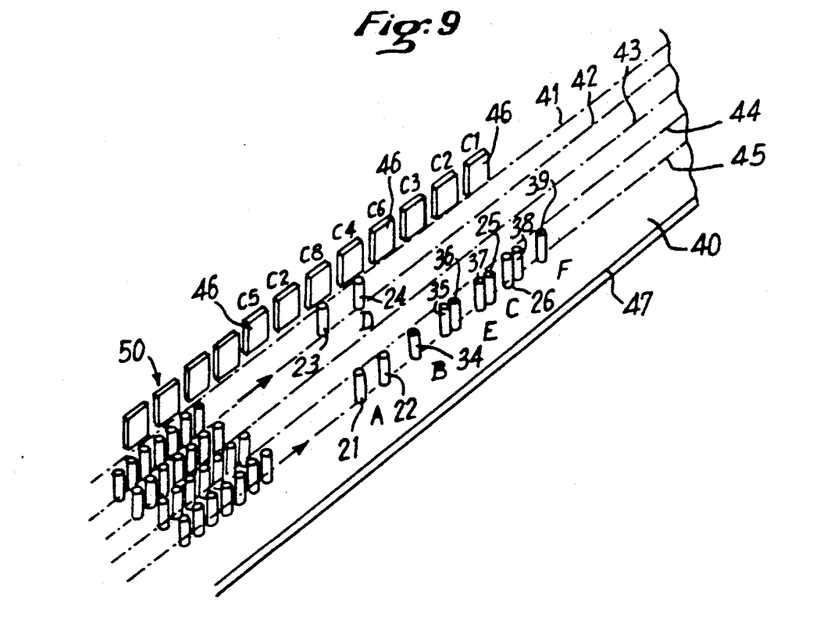
Figure 11:
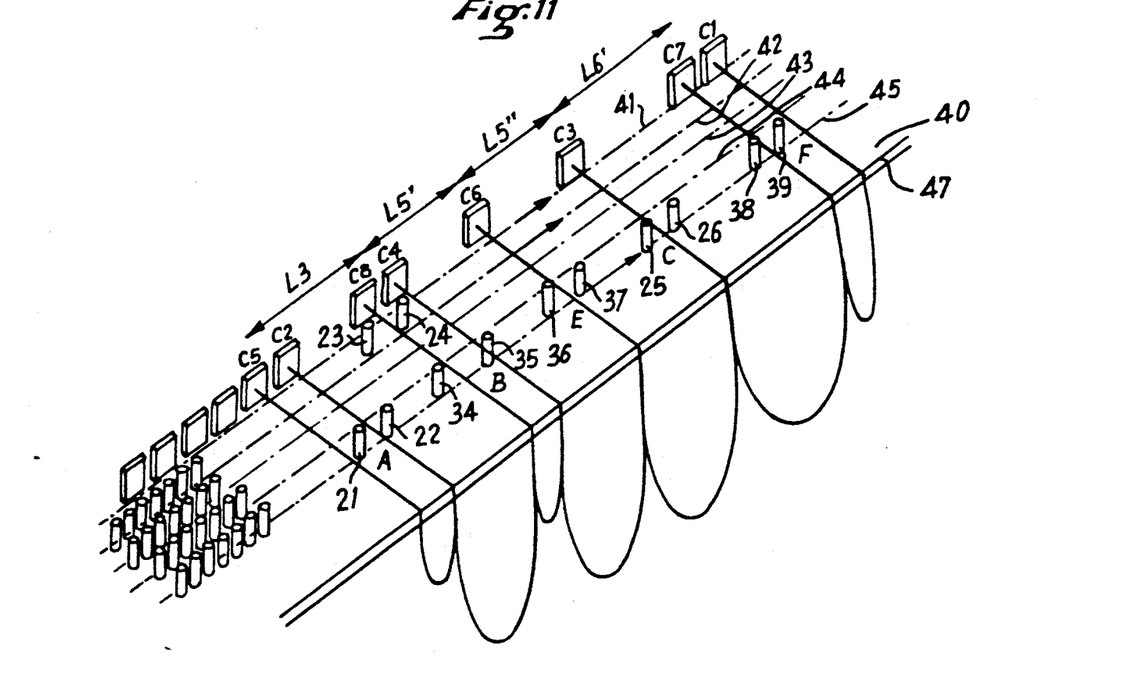
Figure 12:
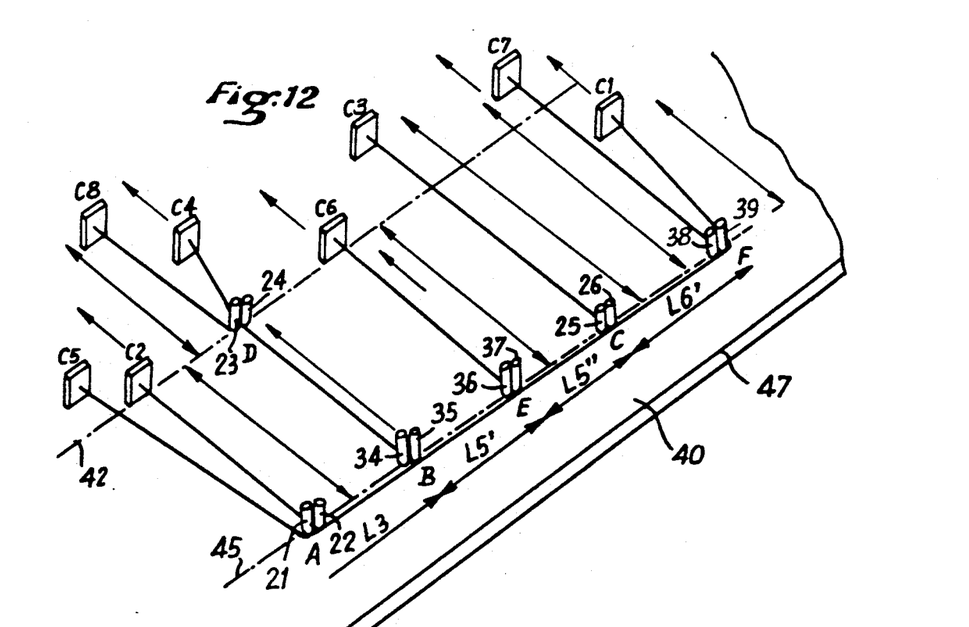

As is illustrated schematically in FIG. 9, the machine for implementing the method of the invention may comprise a flat support 40, for example a horizontal table, with parallel rectilinear guide paths 41 to 45, along which supports 46, each holding a connector C1 to C8 and pins 21 to 26 and 34 to 39, may slide. For the sake of simplification, in FIG. 9, as well as in FIGS. 10 to 12, each assembly formed by a support 46 and a connector C1 to C8 is represented by a single plate. Supports 46 and said pins may be taken from a reserve 50, available on table 40. Positioning of supports 46 and of the pins by sliding along paths 41 to 45 and their subsequent relative displacement may be made manually or under the action of displacement means not shown. In this latter case, these means may be associated with robots, for example controlled by a computer. In FIG. 9, the connectors C1 to C8 and pins 21 to 26 and 34 to 39 have been shown in the preparatory position of FIG. 8.

Figure 3:
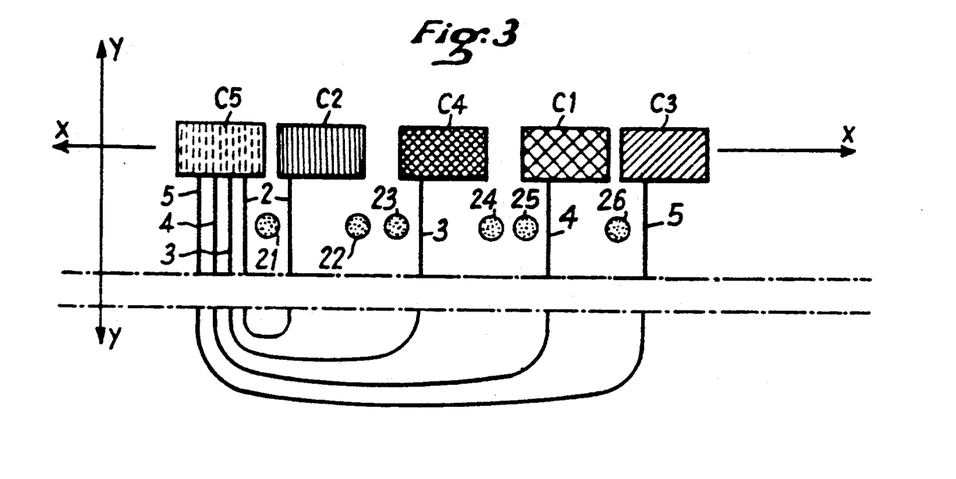
Figure 4:
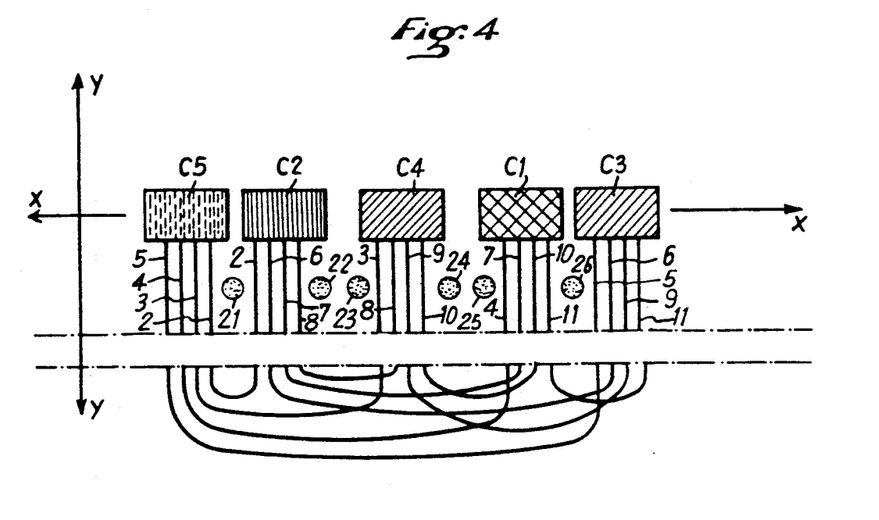
Figure 10:
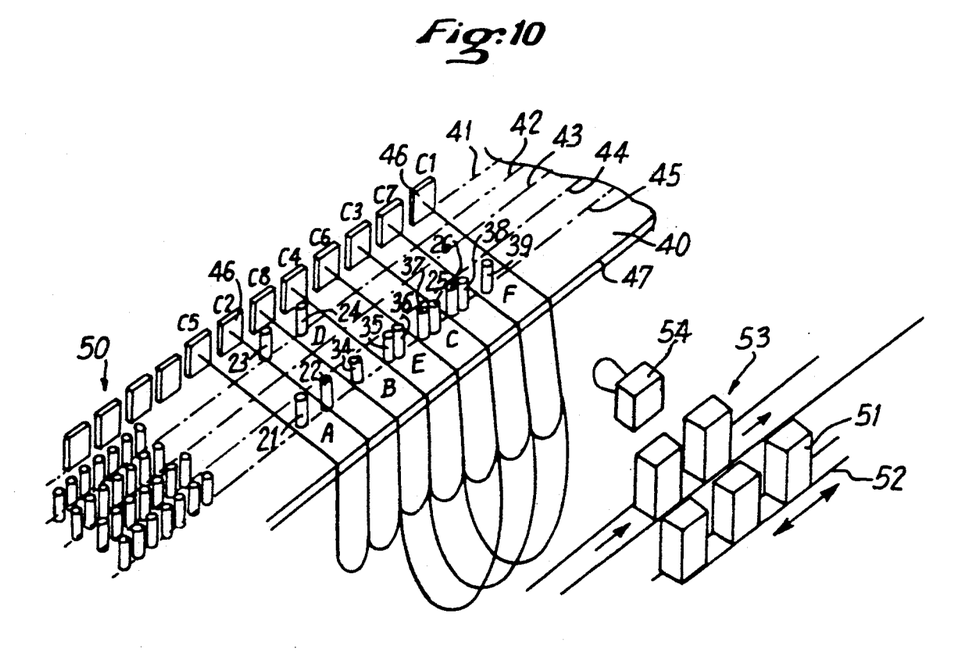

Similarly to what was described in connection with FIGS. 3, 4 and 5, the different conductors forming the wiring harness 30 are coupled by their two ends to the two corresponding connectors, passing through the respective pairs of pins (see FIG. 10). Such coupling may be made by means of automatic plug-in means 51 moving over paths 52, said conductors being brought by a transfer chain 53. The movements of the plug-in means 51 and of the transfer chain 53 may be parallel to the guide paths 41 to 45 and controlled by said computer. A supervision camera 54 may be provided for controlling the operations.

During the operation of coupling the conductors, when connectors C1 to C8 and pins 21 to 26 and 34 to 39 are in the closed up position, in order to avoid congestion of the horizontal table 40, it is advantageous for the large part of the loops formed by said conductors to be able to hang freely outside table 40, from an edge 47 thereof.

Then (see FIG. 11) the connectors C1 to C8 and the pairs of pins are moved apart from each other, along paths 41, 42 and 45 in the same way as shown in FIG. 5. After which, the pins of each pair of pins ar closed up again in order to accurately define the different nodes A to F, then supports 46 are pulled transversely to paths 41 to 45 to stretch the respective conductors (see FIG. 12). Then said conductors may be bound together to form the different bundles, then disposed and shaped so as to obtain the wiring harness 30 of FIG. 7.

What is claimed is:

1. Method of forming a wiring harness comprising a plurality of conductors and connectors, said connectors each having coupling positions for conductor ends and occupying given geographic positions in said harness, wherein each conductor follows a given path inside said wiring harness for connecting a coupling position of one connector to a coupling position of another connector, the paths of said conductors having common sections along which said conductors are bound together in bundles and said wiring harness having an elongate structure comprising a main longitudinal bundle and lateral bundles connected there to at junction nodes, said method comprising the steps of:

(a) providing individual sliding guide members for assembling together the conductors belonging to the same bundle and separating the conductors of different bundles from each other;
    (b) disposing said connectors side by side in the order in which they are located along said main bundle;
    (c) disposing as many sliding guide members in side by side relationship as is necessary for defining said junction nodes;
    (d) connecting the ends of each conductor to the appropriate coupling positions of the two connectors which are to be connected by said conductor, by causing said conductor to pass through the corresponding sliding guide member;
    (e) moving said sliding guide members away form each other until they coincide with said junction nodes of the lateral bundles at the main bundle and moving said connectors away form each other until all slack in said conductors is taken up;
    (f) binding the conductors belonging to the same bundle together and
    (g) releasing the wiring harness thus obtained from said sliding guide members.

2. The method as claimed in claim 1, including a subsequent shaping operation wherein said bundles are shaped to their final form with said connectors in the relative geographic positions which they occupy in said wiring harness.

3. The method as claimed in claim 1, wherein:
in step (b) said connectors in position close to each other are at least approximately aligned;
in step (c) said sliding guide members in position close to each other are at least approximately aligned; and
said alignment of sliding guide members is disposed at least substantially parallel to said alignment of connectors.

4. The method as claimed in claim 3, wherein said connector alignment and said sliding guide member alignment are at least substantially parallel to said main longitudinal bundle of the wiring harness to be obtained.

5. The method as claimed in claim 4, wherein, in step e) said sliding guide members are moved apart along said sliding guide member alignment, whereas said connectors are moved apart along said connector alignment, as well as transversely to this latter alignment.

6. The method as claimed in claim 5, wherein, whatever the side of the main longitudinal bundle where said lateral bundles are located, said transverse moving apart of the connectors is provided on a single side of said connector alignment.

7. The method as claimed in claim 1 forming a wiring harness in which at least some of said lateral bundles comprise branch bundles having connectors at their free ends, wherein additional sliding guide members are provided associated with junction nodes of the branch bundles at the lateral bundles and:
in step (b) the connectors coupled to the ends of said branch bundles are inserted among the connectors of the lateral bundles;
in step (c) said additional sliding guide members are disposed in position close to each other while being inserted in the other sliding guide members;
in step (d) the conductors concerned are caused to pass through the additional siding guide members; and
in step (e) said additional siding guide members are moved away from each other by sliding along said conductors until they coincide with said junction nodes between the branch bundles and the lateral bundles.

8. Device for forming a wiring harness a wiring harness comprising a plurality of conductors and connectors, said connectors each having coupling positions for conductor ends and occupying given geographic positions in said harness, wherein each conductor follows a given path inside said wiring harness for connecting a coupling position of one connector to a coupling position of another connector, the paths of said conductors having common sections along which said conductors are bound together in bundles an said wiring harness having an elongate structure comprising a main longitudinal bundle and lateral bundles connected thereto at junction nodes, comprising:
a support,
sliding guide members capable of moving over said support, and
means for holding the connectors in position, said holding means being able to move over said support.

9. The device as claimed in claim 8, wherein said support is vertical.

10. The device as claimed in claim 8, wherein said support is horizontal.

11. The device as claimed in claim 10, wherein said support is such that a portion of each conductor connected to two connectors is closed up position is not supported by said support and may hang vertically thereoutside.

12. The device as claimed in claim 8, wherein said sliding guide members are formed by pins.

* * * * *